United States Patent
Chiang et al.

[11] Patent Number: 5,886,410
[45] Date of Patent: Mar. 23, 1999

[54] INTERCONNECT STRUCTURE WITH HARD MASK AND LOW DIELECTRIC CONSTANT MATERIALS

[75] Inventors: Chien Chiang, Fremont; Chuanbin Pan, Santa Clara; Vicky M. Ochoa, Pleasanton; Sychyi Fang, Palo Alto; David B. Fraser, Danville; Joyce C. Sum, Cupertino; Gary William Ray, Mountain View; Jeremy A. Theil, Menlo Park, all of Calif.

[73] Assignee: Intel Corporation, Santa Clara, Calif.

[21] Appl. No.: 670,624

[22] Filed: Jun. 26, 1996

[51] Int. Cl.[6] ................................................. H01L 23/485
[52] U.S. Cl. ........................ 257/759; 257/776; 257/760; 438/623; 438/634
[58] Field of Search ..................................... 257/758, 760, 257/773, 774, 776, 759, 40; 438/623, 624, 631, 634, 622

[56] References Cited

U.S. PATENT DOCUMENTS

| | | | |
|---|---|---|---|
| 4,767,724 | 8/1988 | Kim et al. | 257/760 |
| 5,155,576 | 10/1992 | Mizushima | 257/760 |
| 5,399,508 | 3/1995 | Nowak | 437/27 |
| 5,438,006 | 8/1995 | Chang et al. | 437/40 |
| 5,466,639 | 11/1995 | Ireland | 437/195 |
| 5,468,342 | 11/1995 | Nulty et al. | 156/643 |
| 5,488,011 | 1/1996 | Figura et al. | 437/60 |
| 5,510,652 | 4/1996 | Burke et al. | 257/760 |
| 5,548,159 | 8/1996 | Jeng | 257/760 |
| 5,552,638 | 9/1996 | O'Connor et al. | 257/760 |
| 5,604,380 | 2/1997 | Nishimura et al. | 257/759 |
| 5,616,959 | 4/1997 | Jeng | 257/759 |
| 5,661,344 | 8/1997 | Havemann et al. | 257/760 |

OTHER PUBLICATIONS

IBM Technical Disclosure Statement, vol. 37, No. 06A, Jun. 1994, pp. 53–54.

Yoshio Homma et al., Using Selective CMP with Low Permittivity Organic SOG to Achieve Low Capacitance Multilevel Interconnection Jun. 27–29, 1995 VMIC Conference 1995 ISMIC–104/95/0457.

Primary Examiner—David B. Hardy
Attorney, Agent, or Firm—Blakely, Sokoloff, Taylor & Zafman LLP

[57] ABSTRACT

An interconnect system is provided. The interconnect system includes a silicon substrate and a first dielectric layer formed upon the silicon substrate. The interconnect system also includes a first level of at least two electrically conductive lines formed upon the first dielectric layer. The interconnect system further includes a region of low dielectric constant material formed between the at least two electrically conductive lines. The interconnect system also includes a first hard mask formed upon the polymer region.

14 Claims, 7 Drawing Sheets

Fig. 7

INTERCONNECT STRUCTURE WITH HARD MASK AND LOW DIELECTRIC CONSTANT MATERIALS

BACKGROUND OF THE INVENTION

1. Field of the Invention

The present invention generally relates to an interconnect system. More specifically, the present invention relates to an interconnect system including a low dielectric constant material.

2. Description of the Related Art

Modern integrated circuits are generally made up of a silicon substrate containing millions of active and passive devices including transistors, capacitors, and resistors. Such devices are initially isolated from one another, but are later interconnected together to form functional circuits. The quality of the interconnection of these devices drastically affects the performance and reliability of the fabricated integrated circuit. An interconnect system typically includes metal lines, spaced apart from each other, with dielectric layers therebetween that isolate the metal lines from one another. The metal lines typically interconnect the various active and passive devices residing in a silicon wafer to which the interconnect system is coupled.

Inherent in the structure of the interconnect system is a capacitance associated with the metal lines and the distance therebetween, i.e., inter-metal-line capacitance (hereinafter "capacitance"). Decreasing this capacitance is desirable as several advantages can be achieved therefrom, such as reduced RC delay, reduced power dissipation, and reduced cross-talk between the metal lines. As the capacitance is inversely proportional to the distance between the metal lines, one way to reduce the capacitance formed between the lines of an interconnect system would be to increase the space between these lines. However, this option is not desirable because of limitations imposed by packing density.

However, as the capacitance of an interconnect system is also directly proportional with the dielectric constant of a dielectric disposed between these lines, a better way to reduce the capacitance of the interconnect system is to utilize a dielectric material with a low dielectric constant. Typically, interconnect systems use a dielectric material such as silicon dioxide ($SiO_2$). The dielectric constant of $SiO_2$ is approximately 4. Other dielectric materials that are used in interconnect systems include silicon oxifluoride (SiOF), with a dielectric constant of 3.5 and below.

Incorporating dielectric materials with low dielectric constants in interconnect systems, however, is problematic. Low dielectric materials, such as organic polymers, may not adequately mechanically support the structure of the interconnect system as these materials are mechanically weak. Moreover, low dielectric constant materials such as organic polymers are vulnerable to certain processes involved in the fabrication of the interconnect system. For example, polymers have to withstand high temperatures and mechanical stresses at which the interconnect system is subjected. Also, the polymers used in an interconnect system interact with photoresist solvents and developers used in the process of fabrication of the interconnect system. Moreover, polymers are vulnerable to exposure to photoresist solvents and developers as the polymers may dissolve in the solvents or developers and swell. Furthermore, polymers are vulnerable to oxygen plasma used in ashing. Additionally, polymers may be attacked by Chlorine plasma used in etching the metal lines of the interconnect system.

Also, an interconnect system typically utilizes via plugs made of Tungsten (W), by way of non-limiting example, that interconnect the various layers of metal lines within the interconnect system. Once the via plugs are framed in an interconnect system, the via plugs are subjected to a process of chemical mechanical polishing (CMP), wherein a CMP slurry solution is used to polish and thereby planarize the outer parts of the via plugs. The CMP slurry solution, however, can deteriorate or contaminate the polymer. Furthermore, polymers have a relatively high water diffusion constant such that any water mixed or added to the substances used in the process of fabrication may infiltrate into the polymers.

What is needed is an interconnect system that can accommodate the above-mentioned shortcomings of polymers or materials similar thereto.

BRIEF SUMMARY OF THE INVENTION

The present invention provides an interconnect system. The interconnect system includes a silicon substrate, a first dielectric layer formed upon the silicon substrate, and a first level of at least two electrically conductive lines formed upon the first dielectric layer. The interconnect system also includes a first region with a low dielectric constant material formed between the first level of at least two electrically conductive lines and upon said first level of at least two electrically conductive lines. The low dielectric constant material includes an organic polymer that has a dielectric constant in the range of 1.5–3.5 . The interconnect system further includes a first dual layer hard mask formed upon the region with a low dielectric constant material the organic polymer has a thickness, measured between the first dielectric layer and the first dual layer hard mask, in the range of 8,000–14,000 angstroms.

BRIEF DESCRIPTION OF THE DRAWINGS

The features, aspects, and advantages of the present invention will become more fully apparent from the following Detailed Description, appended claims, and accompanying drawings in which:

DETAILED DESCRIPTION OF THE INVENTION

In the following description, numerous specific details are set forth to provide a thorough understanding of the present invention. However, one having an ordinary skill in the art will recognize that the invention can be practiced without these specific details. In some instances, well-known circuits, structures and techniques have not been shown in detail to avoid unnecessarily obscuring the present invention.

Figure 1:
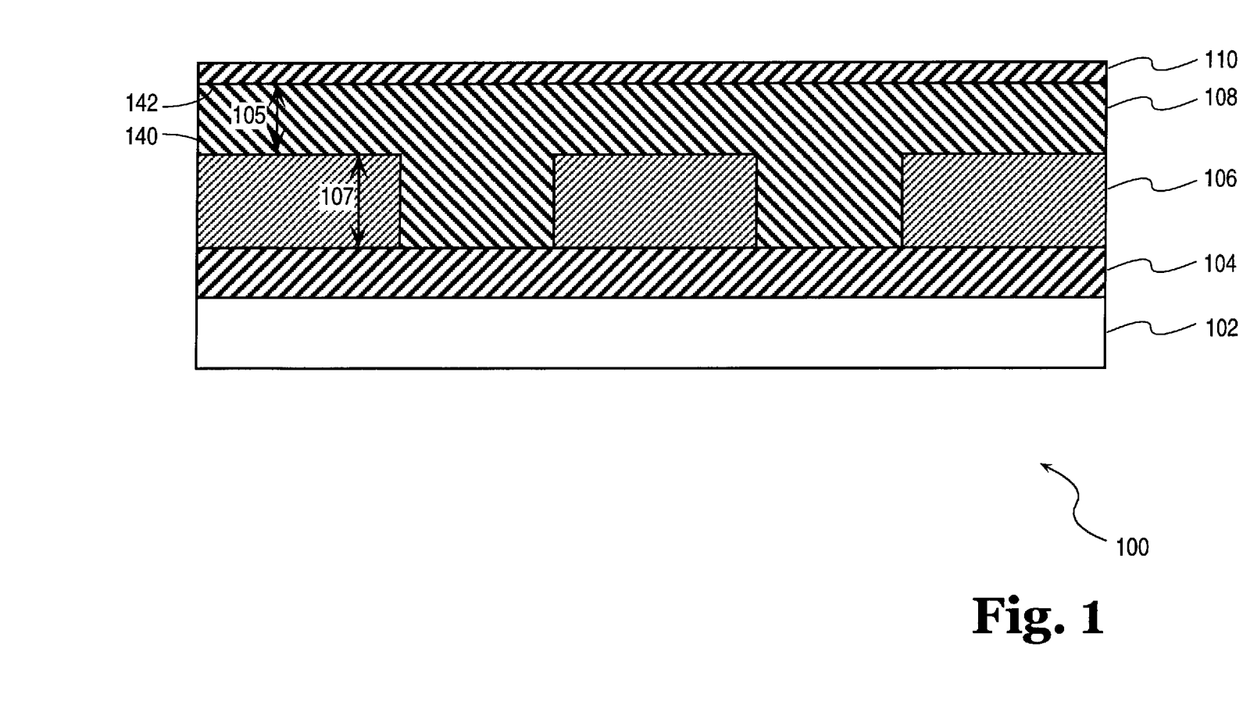
FIG. 1 illustrates a cross-section of an interconnect system according to the present invention.

FIG. 1 illustrates a cross-section of an interconnect system 100 according to the present invention. The interconnect system 100 includes a silicon substrate 102. Substrate 102 can be, by way of non-limiting example, a semiconductor wafer including device regions such as diffused junctions, other structures such as gates, local interconnects, metal layers, or other active or passive device structures or layers. In many cases, depending upon the device being fabricated, device layers or structures, or processing steps used to fabricate the device according to the present invention, may have been omitted to avoid unnecessarily obscuring the present invention.

The interconnect system 100 includes a first dielectric layer 104 formed upon substrate 102. The first dielectric layer 104 serves the purpose of insulating between any conductive structures which can be found in the silicon substrate 102 and other conductive layers or lines which are further formed in the interconnect system 100. Layer 104 typically has a dielectric constant which is substantially equal to 4. The first dielectric layer 104 typically has a thickness in the range of approximately a few thousand Angstroms. For example, the thickness of layer 104 can be approximately 6,000Å. The first dielectric layer 104 can be made of materials such as, but not limited to: silicon dioxide ($SiO_2$), undoped or doped using such dopants as Phosphorus (PSG, Silicate Glass) or Boron and Phosphorus (BPSG, Doped Silicate Glass); silicon nitride ($Si_3N_4$); or silicon oxi-nitride ($SiO_xN_y$).

Following the deposition of the first dielectric layer 104, a first level of at least two electrically conductive interconnect lines 106, which are typically made of aluminum, are formed upon the first dielectric layer 104. The interconnect lines 106 can be formed by depositing a layer of a first electrically conductive material such as aluminum or an alloy thereof upon the first dielectric layer 104. Following the deposition of this first electrically conductive layer, a patterning layer such as photoresist layer (not shown) is formed. The photoresist layer is patterned by well known techniques, which include masking the layer of photoresist, exposing the masked layer of photoresist to light, and then developing the portions not exposed to light. The layer of electrically conductive material is then etched in alignment with the pattern formed in the photoresist layer thereby producing the pattern of interconnect lines 106 shown in FIG. 1. In the preferred embodiment shown in FIG. 1, the electrically conductive lines 106 have a thickness in the range of 4000–10,000 Angstroms.

Once the electrically conductive interconnect lines 106 are etched as explained above, a material with a low dielectric constant is deposited upon and therebetween interconnect lines 106 thereby forming region 108. The low dielectric constant of the material forming region 108 preferably has a value in the range of 1.5–3.5 although, this value can be higher. In the preferred embodiment shown in FIG. 1, the region 108 of material with a low dielectric constant can be a polymer with a thickness in the range of a few thousand Angstroms. Acceptable polymers are the ones that are stable at high temperatures, since most polymers tend to decompose at high temperature. The temperatures at which the polymers need to be stable are generally temperatures within the range of 400°–450°, which are compatible with integrated circuit process temperatures. Commercially available organic polymers, such as Polyarylether, Polyimide, and Polynaphthaline, which comply to the above set forth requirements can be used for layer 108. The polymer region 108 confers the interconnect system 100 a low inter-metal capacitance as the inter-metal capacitance, generally, is proportional with the dielectric constant of the material interposed between metal lines 106.

Following formation of polymer region 108, hard mask 110, which improves the mechanical strength of the interconnect system, is deposited upon polymer region 108. Hard mask 110 is typically made of $SiO_2$ or can be a dual layer including $SiO_2$ and $Si_3N_4$. Hard mask 110 has a higher dielectric constant than the polymer of region 108. For example, the dielectric constant of the hard mask 110 is approximately 4 while the polymers used for region 108 have an average dielectric constant of approximately 2.5. The hard mask 110 typically has a thickness sufficient to withstand process steps such as CMP, metal etch, etc., involved in the fabrication of the interconnect system according to the present invention. Each of these processes may erode part of the hard mask and therefore the thickness of the hard mask is designed to insure that the various processes the interconnect system undergoes do not fully erode hard mask 110. The hard mask 110 can have a thickness in the range of 1000 to 5000 Å. An average thickness 105 of the polymer region measured from a top surface 140 of the metal lines 105 to a bottom surface 142 of hard mask 110 is approximately 6000 Å. The distance 105 between the top surface 140 of the metal lines and the bottom surface 142 of the hard mask 110 can be reduced to 0 such that hard mask 110 can be disposed directly on the top surface 140 of the metal lines 106. In this case, the polymer is deposited between metal lines 106, the dielectric layer 104, and the bottom surface 142 of hard mask 110.

Figure 2:
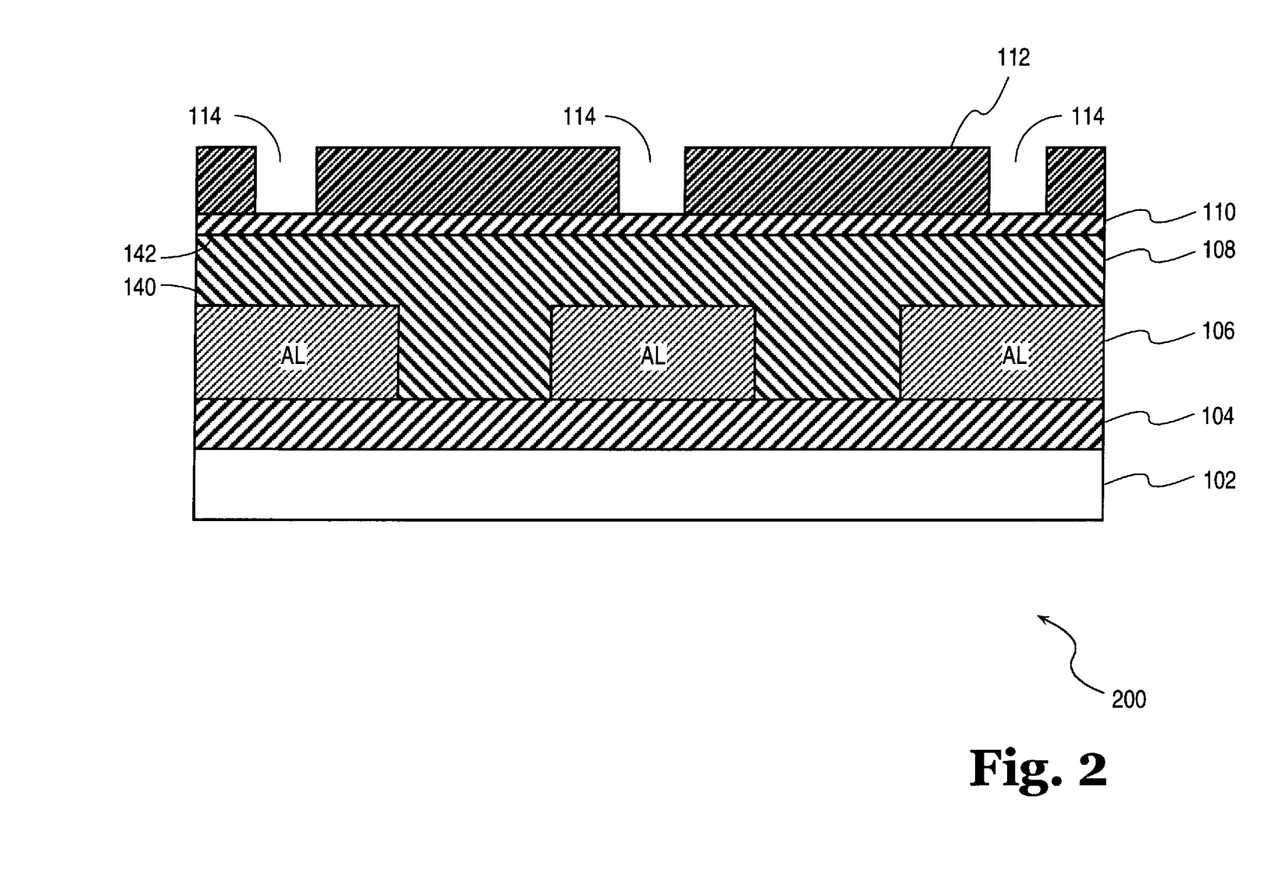
FIG. 2 illustrates a cross-section of an interconnect system with a patterning layer formed upon a hard mask according to the present invention.

FIG. 2 shows a cross-section of the interconnect structure illustrated in FIG. 1 with a patterning layer 112 of photoresist formed upon hard mask 110. The photoresist layer 112 can have a thickness of approximately a few thousand Angstroms to a micron. Photoresist layer 112 is made of a suitable photosensitive material and is processed using standard techniques as explained in the discussion related to FIG. 1. An oxide etch then follows and openings 114, positioned at places where the hard mask 110 is subsequently etched, are formed through photoresist 112. The hard mask 110 is then etched, according to the pattern defined by the photoresist mask, with an etchant having a high selectivity to the hard mask relative to the polymer beneath the mask.

Figure 3:
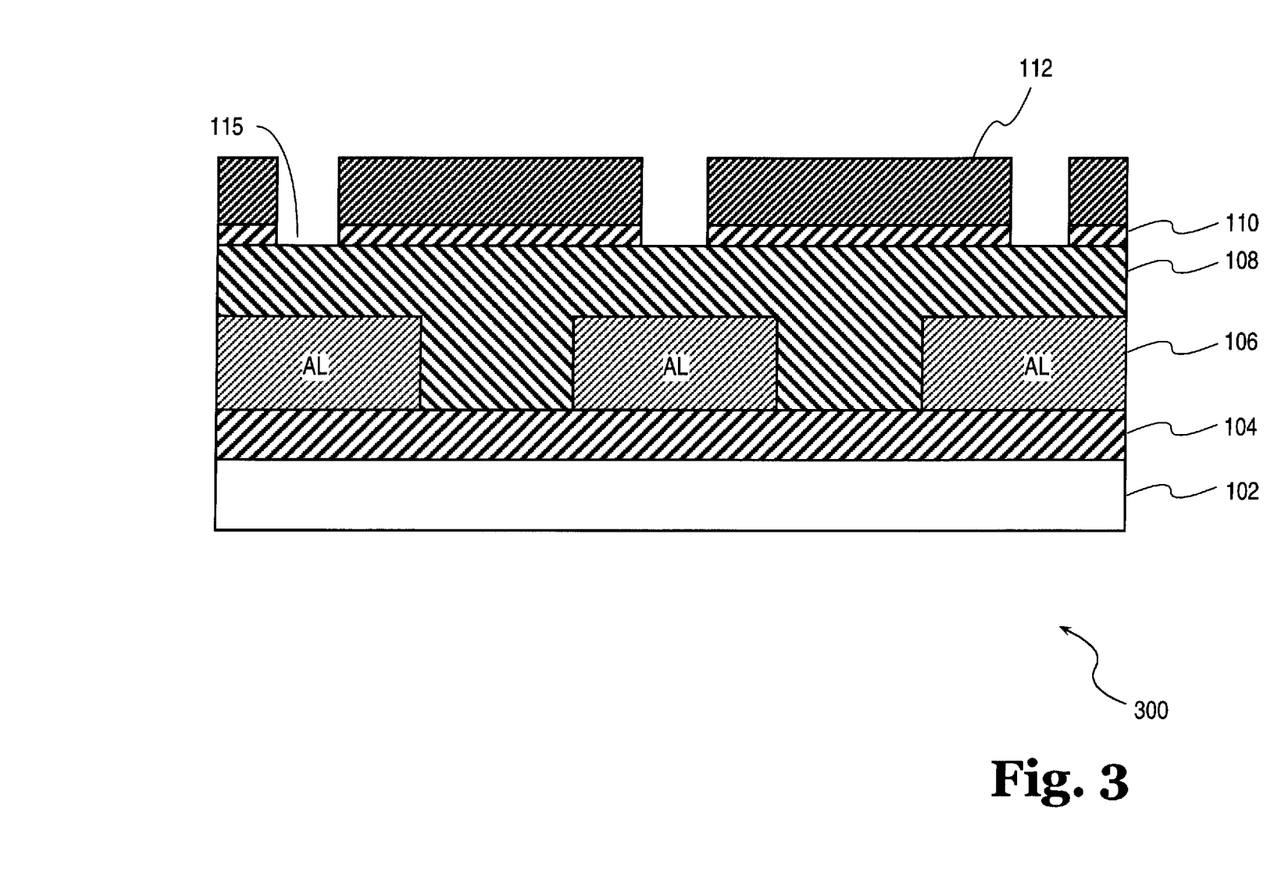
FIG. 3 shows a hard mask displaying a pattern of openings therethrough.

Once the hard mask 110 is etched, it displays a pattern with openings 115 therethrough as shown in FIG. 3. The hard mask 110 with the pattern of openings 115 therethrough is thereafter used as a mask in the subsequent process of etching the polymer region 108. The polymer region 108 is subsequently etched according to the pattern of openings 115 of the etched hard mask 110.

Figure 4:
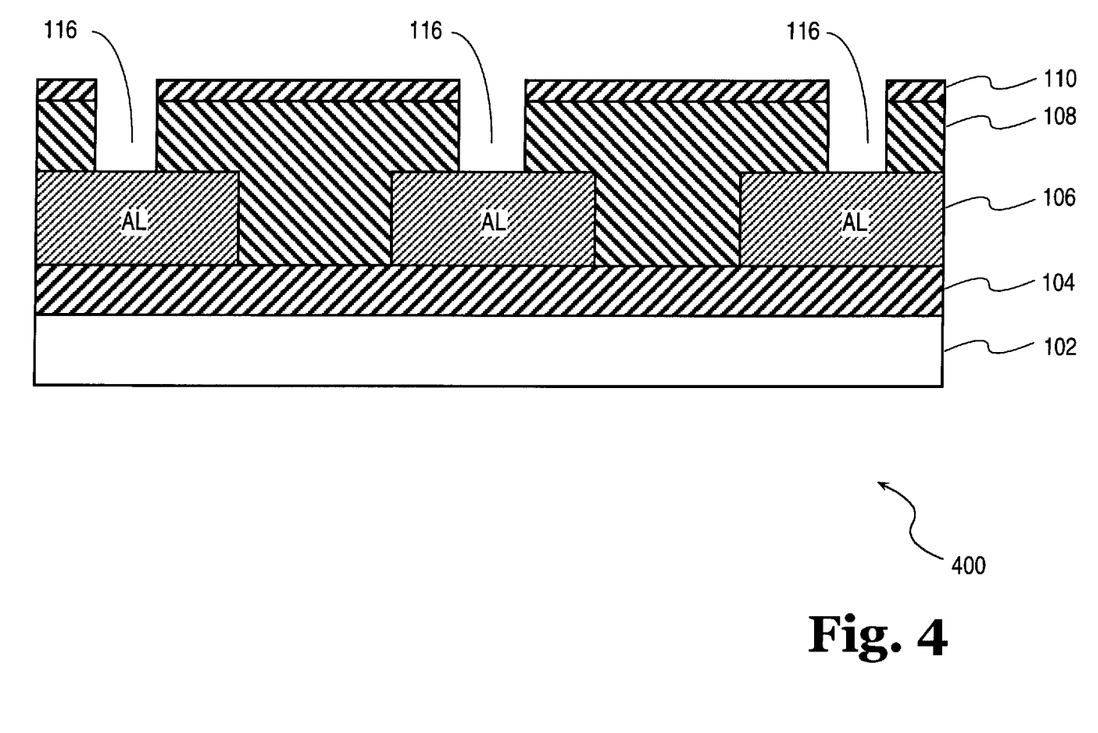
FIG. 4 shows a cross-section of an interconnect structure with via holes etched through a polymer region.

FIG. 4 shows a cross-section of the interconnect structure 400 with via holes 116 etched through the polymer region 108. Both the hard mask and the polymer layer are subjected to plasma etching although the etchants may be different. Types of etchants used for hard masks include CF4, CHF3, C3F8, C2H6, and SF6, with dilutants such as Argon or Helium. Etchants used for polymers include those used for the hard mask, and also 02 and 02/CHF3, also with dilutants such as Argon or Helium. The remaining photoresist mask 112 is removed during the etching of the polymer by an etchant having a high selectivity to the photoresist material and to the polymer relative to the hard mask. To summarize, the patterned photoresist is used to etch the hard mask, which is subsequently used to etch the polymer region 108.

Figure 5:
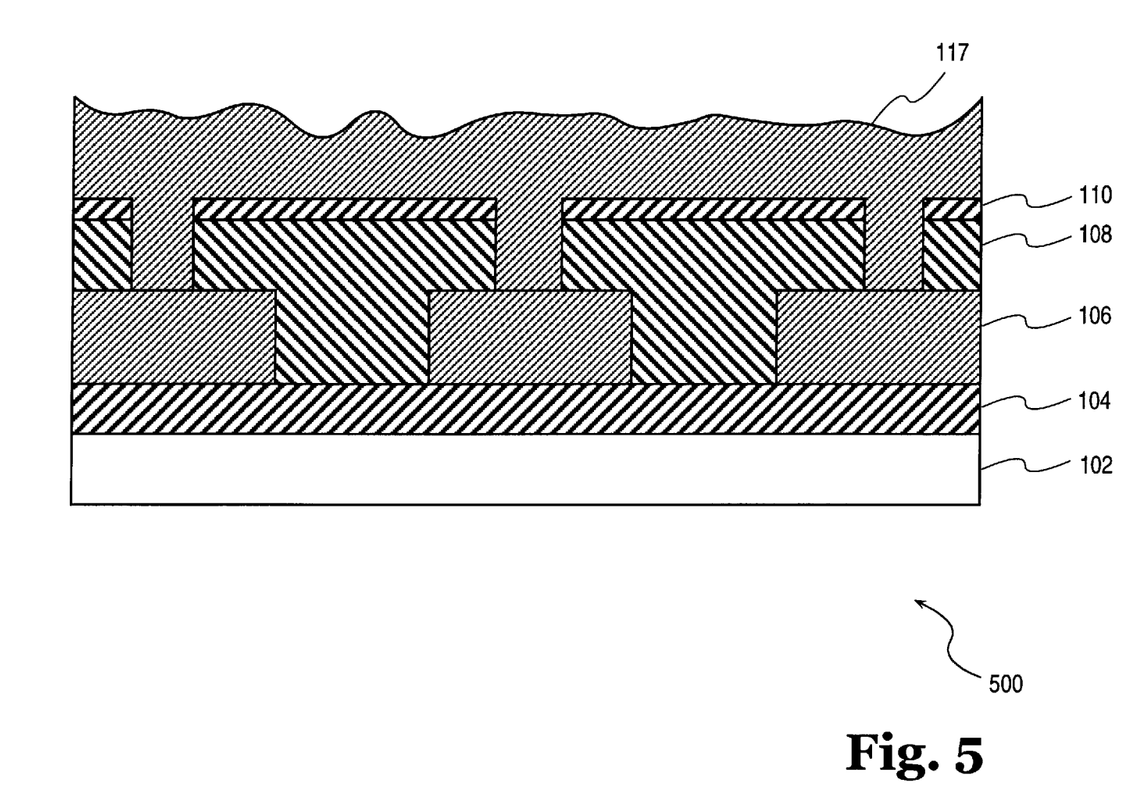
FIG. 5 illustrates a cross-section of an interconnect system with a layer of metal formed over the hard mask.

FIG. 5 shows an interconnect system with a layer 117 of electrically conductive material such as Tungsten (W)

formed upon hard mask 110. The electrically conductive material is blanket deposited upon hard mask 110 and into via holes 116 by a process of chemical vapor deposition (CVD), which is well known in the art.

Figure 6:
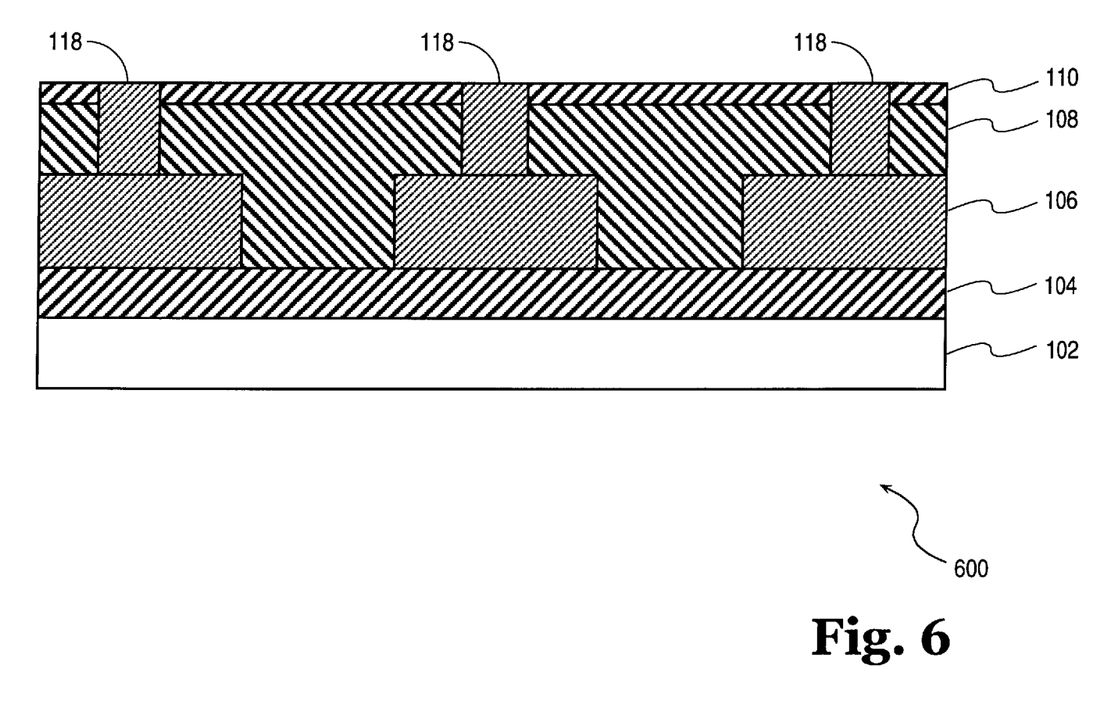
FIG. 6 illustrates a cross-section of an interconnect system with via plugs formed therein.

Following the Tungsten blanket deposition, a process of chemical mechanical polishing (CMP) is applied to the layer of Tungsten 117 thereby providing the interconnect system 600 shown in FIG. 6. The CMP process ensures that the top surface of each via plug 118 is planarized and the rest of the Tungsten, deposited on top of the hard mask 110 is removed. Via plugs 118 serve the purpose of electrically interconnecting electrically conductive interconnect lines 106 with other interconnect lines (not shown) which are further deposited upon hard mask 110. A CMP slurry, used in the CMP process, is selected to have a higher selectivity to Tungsten than to hard mask 110. The slurries can be, by way of non-limiting example, Silica or Aluminum with an Oxidizer. As the CMP slurry may contaminate the polymer region 108, the hard mask 110 prevents the contamination of polymer region 108 by the CMP slurry. The hard mask 110, thus, works as a CMP stop layer.

Figure 7:
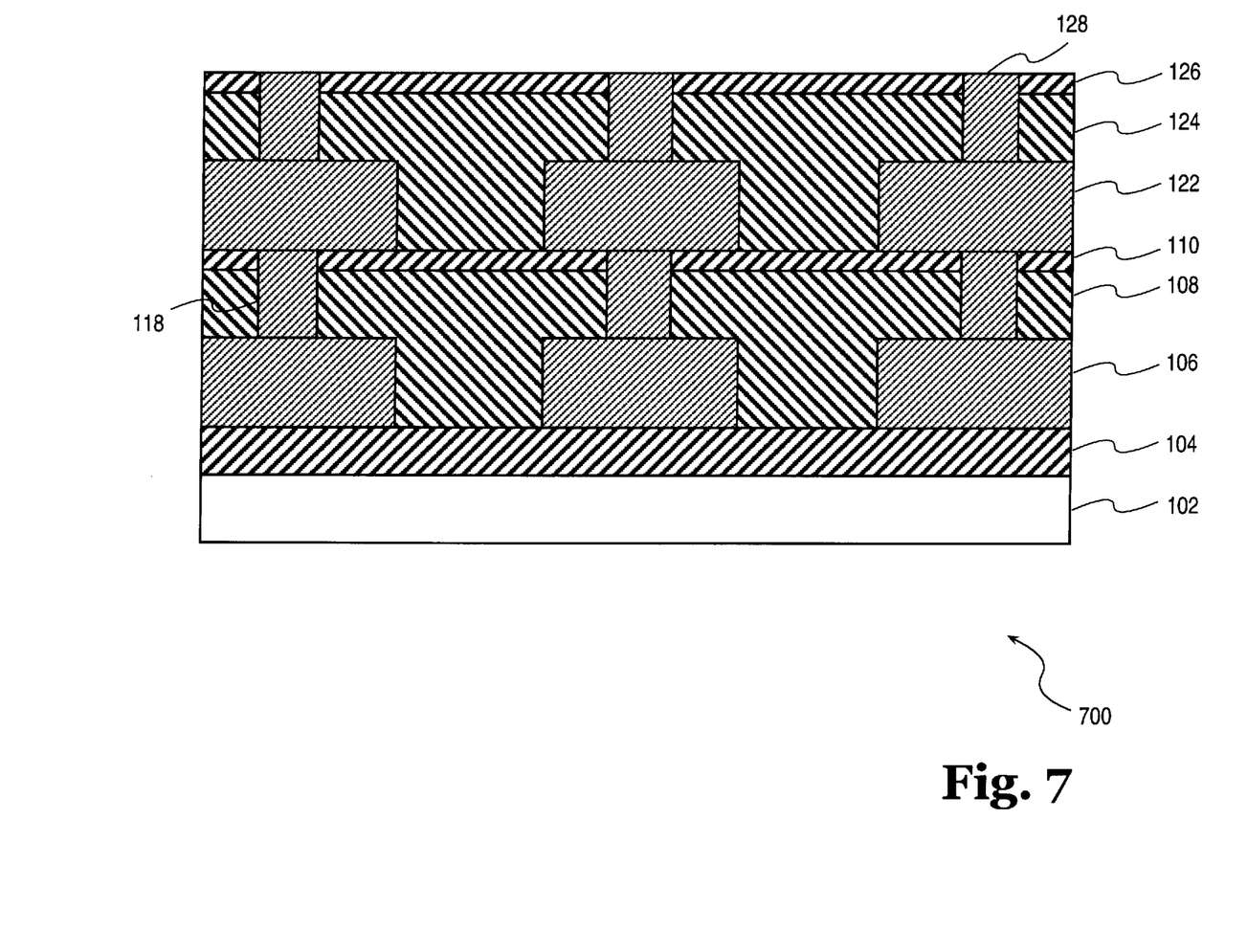
FIG. 7 illustrates a cross-section of a two-level interconnect system according to the present invention.

FIG. 7 illustrates an interconnect system which includes a second level of electrically conductive lines 122, a second region of polymer 124, a second hard mask 126 and a second level of via plugs 128. The second level of electrically conductive lines 122, the second region of polymer 124, the second hard mask 126 and the second level of via plugs 128 are made of materials substantially similar to the materials included the interconnect system described in connection with FIGS. 1, 2, and 3. Similarly, the processes used in the fabrication of the above layers and regions are substantially the same as the processes used in the fabrication of the interconnect system of FIGS. 1, 2, and 3.

The second level of electrically conductive lines 122 is formed by etching a second layer of electrically conductive material deposited on top of hard mask 110. The second layer of electrically conductive material is preferably made of aluminum or alloys thereof. A standard process of photolithography is used to pattern the second layer of electrically conductive material. A gas mixture such as $BCl_3$ and $Cl_2$ is used to form a plasma which is used as an etchant. However, the combination of aluminum and of the etchant causes Chlorine to be released. Chlorine would attack the first polymer region 108 if the second level of electrically conductive lines 122 were directly deposited over the first polymer region 108 in the absence of hard mask 110. The use of hard mask 110, according to the present invention, prevents the released Chlorine from interacting with the first region of polymer 108. In this manner, the hard mask 110 also serves as a metal etch stop layer.

A photoresist stripping etchant involved in removing the remaining photoresist from the second electrically conductive layer 122 may attack the polymer in the absence of hard mask 110. Typically, a solvent and oxygen plasma are used to strip the remaining photoresist layer from the second level of electrically conductive lines 122. Oxygen plasma reacts with the polymer, forming volatile gases. The hard mask 110 prevents such interaction from occurring by stopping the oxygen plasma at the level of the hard mask 110. Hard mask 110 therefore also serves as a protection layer preventing the photoresist stripping etchant from attacking the polymer.

The hard mask 110 thus serves multiple purposes. First, it serves the purpose of a patterning mask for defining via holes into the polymer. Second, it serves as a Tungsten CMP stop during the process of CMP of the Tungsten. Third, hard mask 110 serves the purpose of metal etch stop which prevents a polymer from being attacked as a result of a metal process performed on the metal disposed on top of the hard mask. Additionally, the hard mask 110 serves as a barrier protection against the photoresist strip etchant process, which is performed to strip down the photoresist material left on a second or higher level of electrically conductive lines 122.

In the foregoing specification, the invention has been described with reference to specific embodiments thereof. It will however be evident that various modifications and changes can be made thereto without departing from the broader spirit and scope of the invention as set forth in the appended claims. The specification and drawings are, accordingly, to be regarded in an illustrative rather than a restrictive sense. Therefore, the scope of the invention should be limited only by the appended claims.

What is claimed is:

1. An interconnect system comprising:

a silicon substrate;

a first dielectric layer formed upon said silicon substrate;

a first level of at least two electrically conductive lines formed upon said first dielectric layer;

a first region with a low dielectric constant material formed between said first level of at least two electrically conductive lines and upon said first level of at least two electrically conductive lines, said low dielectric constant material includes an organic polymer that has a dielectric constant in the range of 1.5–3.5;

a first dual layer hard mask formed upon said region with a low dielectric constant material; and said organic polymer having a thickness, measured between the first dielectric layer and the first dual layer hard mask, in the range of 8,000 to 14,000 angstroms.

2. The interconnect system of claim 1 wherein said first dual layer hard mask has a dielectric constant substantially equal to 4.

3. The interconnect system of claim 2 wherein said first dual layer hard mask has a thickness in the range of 1000 to 5000 Angstroms.

4. The interconnect system of claim 3 wherein said organic polymer is selected from a group of materials consisting of Polyimide, Perylene, Polyarylether, Aerogel, and Polynaphthaline.

5. The interconnect system of claim 4 wherein for each of said at least two first level electrically conductive lines, said first dual layer hard mask and said organic polymer have at least one via hole therethrough, with an electrically conductive via plug formed therein.

6. The interconnect system of claim 5 wherein said silicon substrate includes discrete passive and active devices.

7. An interconnect system comprising:

a silicon substrate;

a first dielectric layer formed upon said silicon substrate;

a first level of at least two electrically conductive lines formed upon said first dielectric layer;

a first region with a first low dielectric constant material formed between said first level of said at least two electrically conductive lines;

a first dual layer hard mask formed upon said region with a low dielectric constant material;

a second level of at least two electrically conductive lines formed upon said first dual layer hard mask;

a second region with a second low dielectric constant material formed between said second level of said at least two electrically conductive lines; and a second dual layer hard mask formed upon said second region.

8. The interconnect system of claim 7 wherein said second region is formed upon said second level of said at least two electrically conductive lines.

9. The interconnect system of claim 8 wherein said first and second low dielectric constant materials include an organic polymers.

10. The interconnect system of claim 9 wherein said organic polymer has a dielectric constant in the range of 1.5–3.5.

11. The interconnect system of claim 10 wherein a thickness of each of said first and second organic polymers measured between the second dielectric layer and the second dual layer hard mask is in the range of 8,000 to 14,000 Angstroms.

12. The interconnect system of claim 11 wherein said second dual layer hard mask has a dielectric constant substantially equal to 4.

13. The interconnect system of claim 12 wherein said second dual layer hard mask has a thickness in the range of 1000 to 5000 Angstroms.

14. The interconnect system of claim 13 wherein for each of said at least two second level electrically conductive lines said second dual layer hard mask and said organic polymer have at least one via hole therethrough, with an electrically conductive via plug formed therein.

* * * * *

UNITED STATES PATENT AND TRADEMARK OFFICE
CERTIFICATE OF CORRECTION

PATENT NO. : 5,886,410
DATED : March 23, 1999
INVENTOR(S) : Chiang et al.

It is certified that error appears in the above-identified patent and that said Letters Patent is hereby corrected as shown below:

In column 2, line 28, delete "constant material the organic polymer" and insert -- constant material. The organic polymer --.

Signed and Sealed this

Fifth Day of December, 2000

*Attest:*

Q. TODD DICKINSON

*Attesting Officer*

*Director of Patents and Trademarks*